(12) United States Patent
Maiti et al.

(10) Patent No.: US 10,008,260 B1
(45) Date of Patent: Jun. 26, 2018

(54) CLOCK GENERATION CIRCUITRY FOR MEMORY APPLICATIONS

(71) Applicant: ARM Limited, Cambridge (GB)

(72) Inventors: Bikas Maiti, Austin, TX (US); Rahul Mathur, Austin, TX (US); Sanjay Mangal, Austin, TX (US)

(73) Assignee: ARM Limited, Cambridge (GB)

( * ) Notice: Subject to any disclaimer, the term of this patent is extended or adjusted under 35 U.S.C. 154(b) by 0 days. days.

(21) Appl. No.: 15/490,352

(22) Filed: Apr. 18, 2017

(51) Int. Cl.
*G11C 7/22* (2006.01)
*G11C 11/419* (2006.01)

(52) U.S. Cl.
CPC .............. *G11C 11/419* (2013.01); *G11C 7/22* (2013.01); *G11C 7/222* (2013.01)

(58) Field of Classification Search
CPC ......... G11C 11/419; G11C 7/22; G11C 7/222; H01L 2924/00; H01M 3/07; G09G 3/3677; G09G 2310/0289; G09G 3/3696
USPC ..................... 365/154, 189.11, 233.1, 233.12
See application file for complete search history.

(56) References Cited

U.S. PATENT DOCUMENTS

| 6,166,969 | A  | * | 12/2000 | Song ....................... G11C 7/06 327/333 |
| 6,339,553 | B1 | * | 1/2002  | Kuge ................... G11C 7/1066 327/291 |
| 8,164,372 | B2 | * | 4/2012  | Mitsubori ............ G11C 7/1051 327/149 |

* cited by examiner

*Primary Examiner* — Tan T Nguyen
(74) *Attorney, Agent, or Firm* — Pramudji Law Group PLLC; Ari Pramudji

(57) ABSTRACT

Various implementations described herein are directed to an integrated circuit having level shift circuitry that receives a clock signal in a first voltage domain from a first voltage supply and provides a level shifted clock signal in a second voltage domain based on a second voltage supply that is different than the first voltage supply. The integrated circuit may include clock generator pulse circuitry that receives the clock signal in the first voltage domain from the first voltage supply and receives the level shifted clock signal in the second voltage domain from the level shift circuitry.

20 Claims, 8 Drawing Sheets

US 10,008,260 B1

CLOCK GENERATION CIRCUITRY FOR MEMORY APPLICATIONS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, some memory devices attempt to support large range level shifting to enable Dynamic Voltage Frequency Scaling (DVFS). Some of these memories may support dual voltage rails, e.g., one for a bitcell core circuitry (VDDCE) and another for periphery circuitry (VDDPE). VDDCE lowering may be limited by bitcell retention voltage and is typically held at higher voltages compared to VDDPE. On the other hand, VDDPE lowering may be limited by internal circuitry. Typically, lowering VDDPE may be small, and this minor voltage difference may potentially limit an overall power savings on the chip, as a whole. Thus, there exists a need to improve integrated circuitry to enable Dynamic Voltage Frequency Scaling (DVFS) in a more efficient manner.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to clock generation circuitry for memory applications. In an aspect, the clock generation circuitry described herein may refer to an efficient and reliable clock generation circuit in memory for large range level shifting. In another aspect, the clock generation circuitry described herein may refer to a unique and reliable circuit implementation for fast internal clock generation in memory for large range level shift applications.

Various implementations of clock generation circuitry for memory applications will now be described in greater detail herein with reference to FIGS. 1A-3.

Figure 1A:
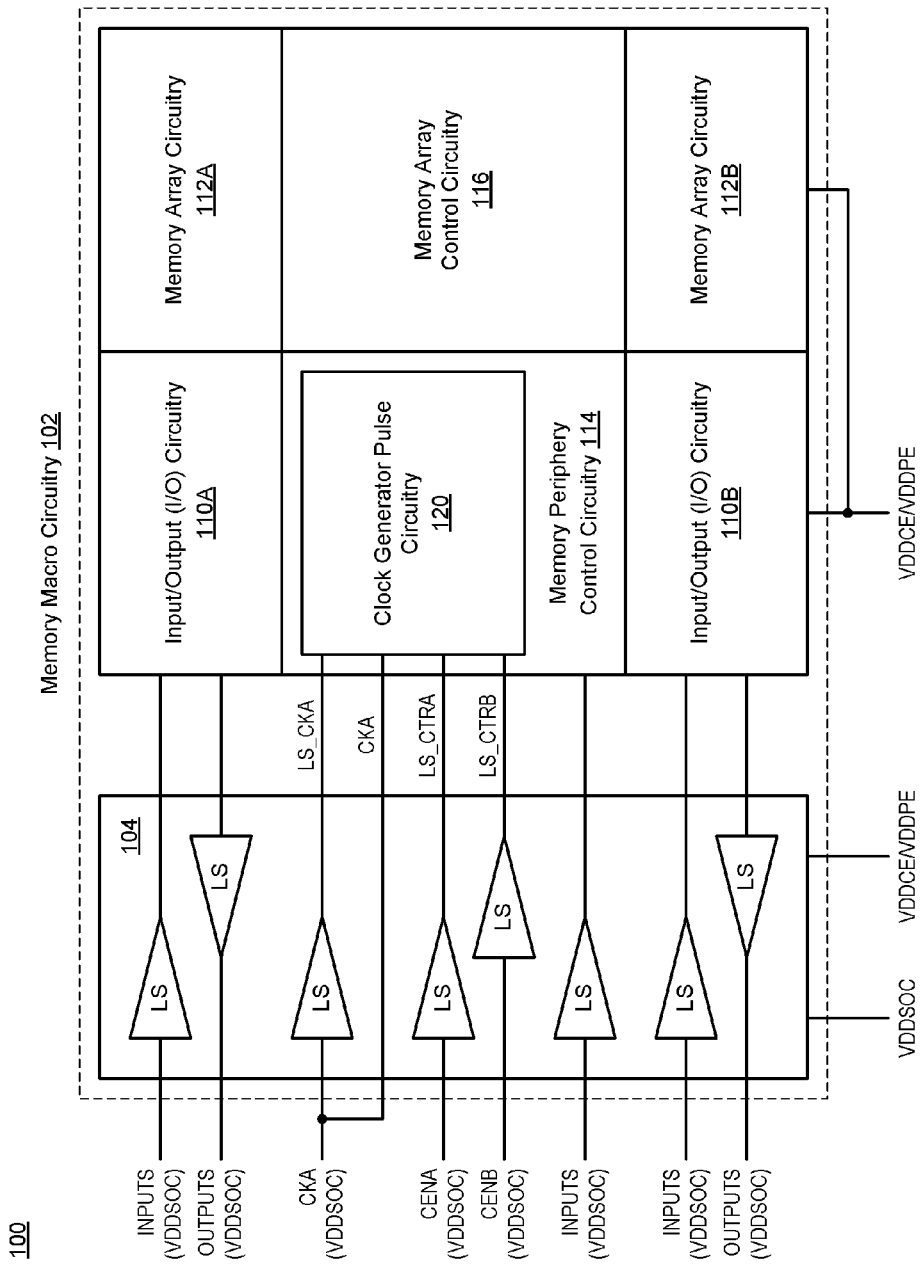
FIGS. 1A-1C illustrate various diagrams of memory circuitry in accordance with various implementations described herein.
Figure 1B:
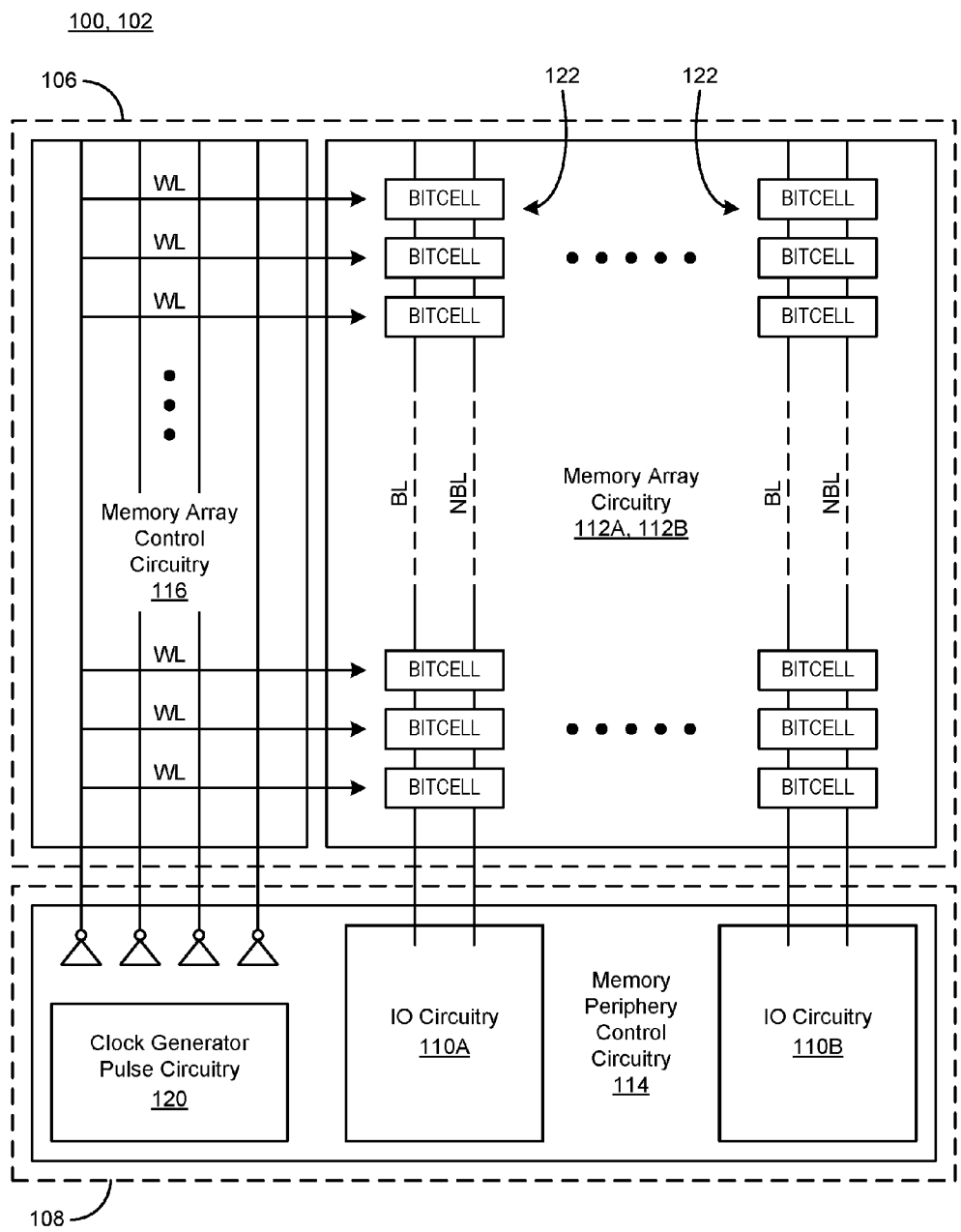
Figure 1C:
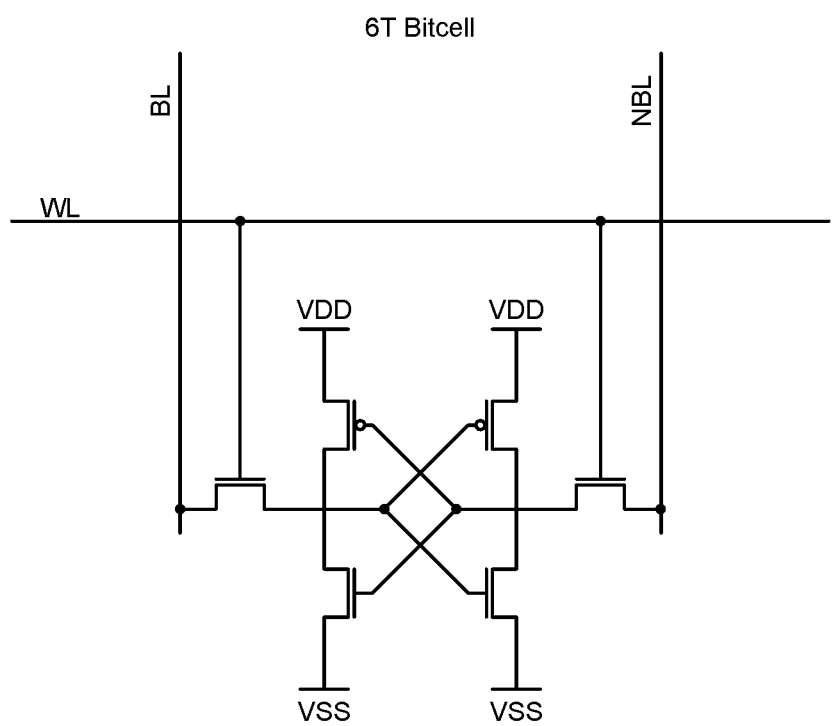

FIGS. 1A-1C illustrate various diagrams of memory circuitry in accordance with various implementations described herein. In particular, FIG. 1A illustrates a block diagram of the memory circuitry 100 showing different voltage domains in memory and input/output (I/O) signal transitions, FIG. 1B illustrates a detailed diagram of memory circuitry 102, and FIG. 1C illustrates a schematic diagram of memory cell circuitry 130 (e.g., bitcell) that may be utilized in the memory circuitry 100.

As shown in FIG. 1A, the memory circuitry 100 may be configured to operate in multiple voltage domains (or multiple power domains) and thus receive multiple voltage supply signals in the multiple voltage domains. In some scenarios, the memory circuitry 100 may be implemented with memory macro circuitry 102 that is configured to receive various inputs from the multiple voltage domains and provide various outputs to multiple voltage domains. The memory circuitry 100 may receive a clock signal CKA and chip enable signals CENA, CENB in a first voltage domain from a first voltage supply. In some instances, the clock signal CKA may be referred to as CLK. The first voltage supply may comprise a system-on-a-chip (SOC) logic voltage supply (VDDSOC).

The memory circuitry 100 may include level shift circuitry 104 having one or more level shift (LS) components configured to receive various input signals in the first voltage domain from the first voltage supply VDDSOC and provide one or more level shift (LS) voltages to various other components of the memory circuitry 100. In some implementations, the level shift circuitry 104 may receive the clock signal CKA in the first voltage domain from the first voltage supply VDDSOC and provide a level shifted clock signal LS_CKA in a second voltage domain (that is different than the first voltage domain) based on a second voltage supply that is different than the first voltage supply VDDSOC. The second voltage supply may comprise a core voltage supply VDDCE. The level shift circuitry 104 may also receive the chip enable signals CENA, CENB in the first voltage domain from the first voltage supply VDDSOC and provide level shifted chip enable signals LS_CTRA, LS_CTRB in the second voltage domain based on the second voltage supply VDDCE. The second voltage supply may also comprise a periphery voltage supply VDDPE.

The memory circuitry 100 may include input/output (I/O) circuitry 110A, 110B, memory array circuitry 112A, 112B, memory periphery control circuitry 114, and memory array control circuitry 116. The memory circuitry 100 may include clock generator pulse circuitry 120. As shown in FIG. 1A, the clock generator pulse circuitry 120 may receive the clock signal CKA in the first voltage domain from the first voltage supply VDDSOC, receive the level shifted clock signal LS_CKA in the second voltage domain from the level shift circuitry 104 (based on the second voltage supply VDDCE), and further receive the level shifted chip enable signals LS_CTRA, LS_CTRB from the level shift circuitry 104 (based on the second voltage supply VDDCE).

The level shift circuitry 104 may receive the clock signal CKA in the first voltage domain as a first direct input from the first voltage supply (VDDSOC). Further, the clock generator pulse circuitry 120 may be separate from the level shift circuitry 102, and the clock generator pulse circuitry 120 may separately receive the clock signal CKA in the first voltage domain as a second direct input from the first voltage supply (VDDSOC). In some implementations, another clock signal CKB may be internally generated in the first voltage domain based on the clock signal CKA. In this instance, the clock signal CKA may be referred to as a first clock signal CKA, and the clock signal CKB may be referred to as a second clock signal CKB.

As shown in FIG. 1B, the memory circuitry 100 may be subdivided and include core circuitry 106 and periphery circuitry 108 with the clock generator pulse circuitry 120. As shown, the memory array circuitry 112A, 112B may include an array of bitcells 122 arranged in columns and rows. Further, the input/output (I/O) circuitry 110A, 110B may be configured for accessing each of the bitcells in the array of bitcells 112 via one or more selected wordlines (WL) and one or more selected bitlines (BL, NBL). The control circuitry may include the memory periphery control circuitry 114 and the memory array control circuitry 116. In some scenarios, the memory periphery control circuitry 114 may be implemented as a column decoder for selecting each bitcell in the array of bitcells with a bitline signal via the one or more selected bitlines (BL, NBL). The one or more selected bitlines (BL, NBL) may include one or more selected pairs of complementary bitlines (BL/NBL, . . . , BLn/NBLn). Further, as shown, the memory periphery control circuitry 114 may include the clock generator pulse circuitry 120, which is described in greater detail herein below. In some scenarios, the memory array control circuitry 116 may be implemented as a row decoder for selecting each bitcell in the array of bitcells with a wordline signal via the one or more wordlines (WL).

The memory circuitry 100 may be implemented as an integrated circuit (IC) with various types of memory, such as, e.g., random access memory (RAM), and/or any other types of memory, including any type of volatile memory and non-volatile memory. In some implementations, the memory circuitry 100 may be implemented as an IC with single and dual rail memory architectures. In other implementations, the memory circuitry 100 may be integrated with computing circuitry and related components on a single chip. Further, the memory circuitry 100 may be implemented in an embedded system for various types of electronic, mobile, and/or biometric applications.

As shown in FIG. 1C, each bitcell 122 in the memory array circuitry 112A, 112B may be referred to as a memory cell, and each bitcell 122 may be configured to store at least one data bit value (e.g., a data value associated with logical '0' or '1'). The array of bitcells 122 of the memory array circuitry 112 may include any number of bitcells or memory cells arranged in various configurations, such as, e.g., a two-dimensional (2D) memory array having columns and rows of multiple bitcells arranged in a 2D grid pattern with 2D indexing capabilities. Further, each bitcell 122 may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 6T SRAM bitcells with minimum-size transistors. Thus, in some implementations, careful optimization of design memory assist circuits may be used to deliver low power memory operation.

As shown in FIG. 1C, static RAM bitcells may include a 6T bitcell, which may have access ports controlled by wordlines. In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Therefore, although these multi-ports transistor types may vary within each bitcell, there may also be a need to have a variation between arrays as in a left half array and a right half array.

Figure 2A:
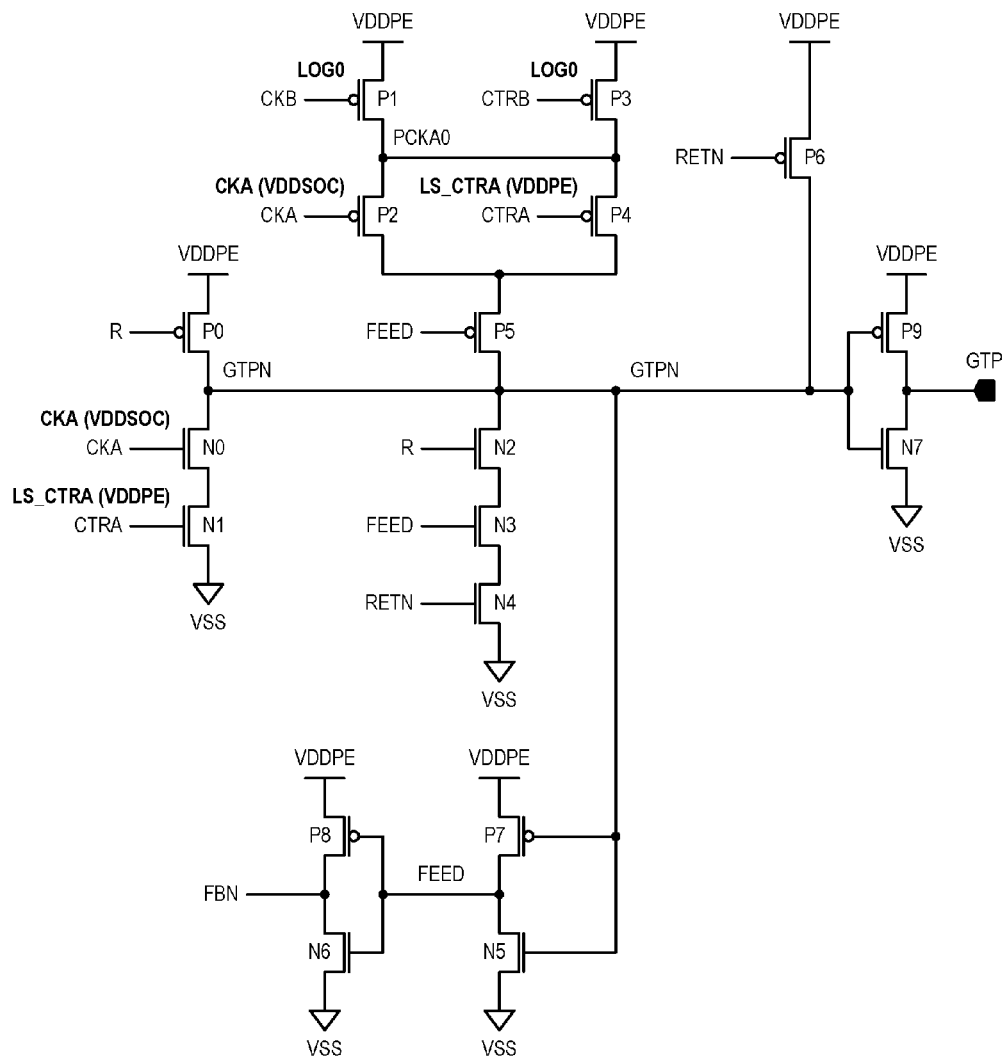
FIGS. 2A-2D illustrate various schematic diagrams of clock generation circuitry in accordance with various implementations described herein.
Figure 2B:
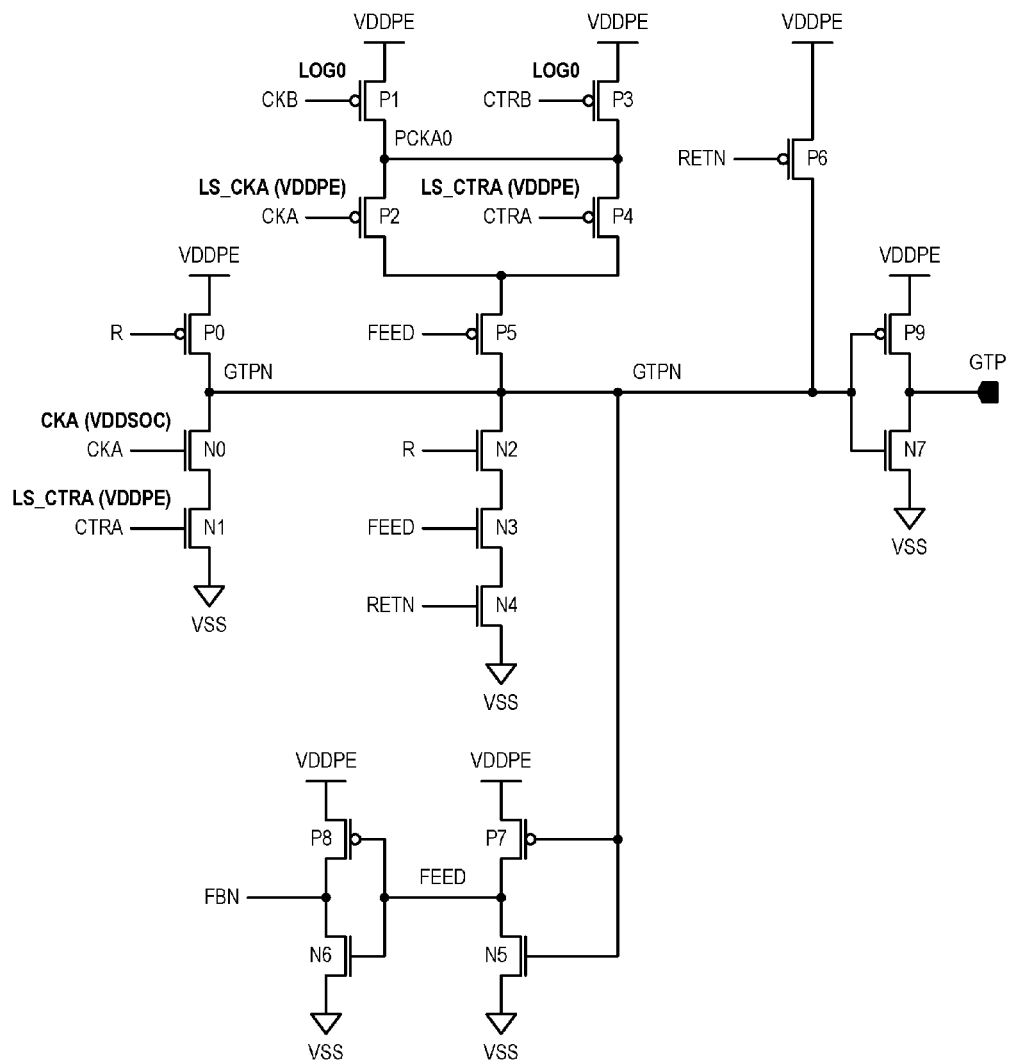
Figure 2C:
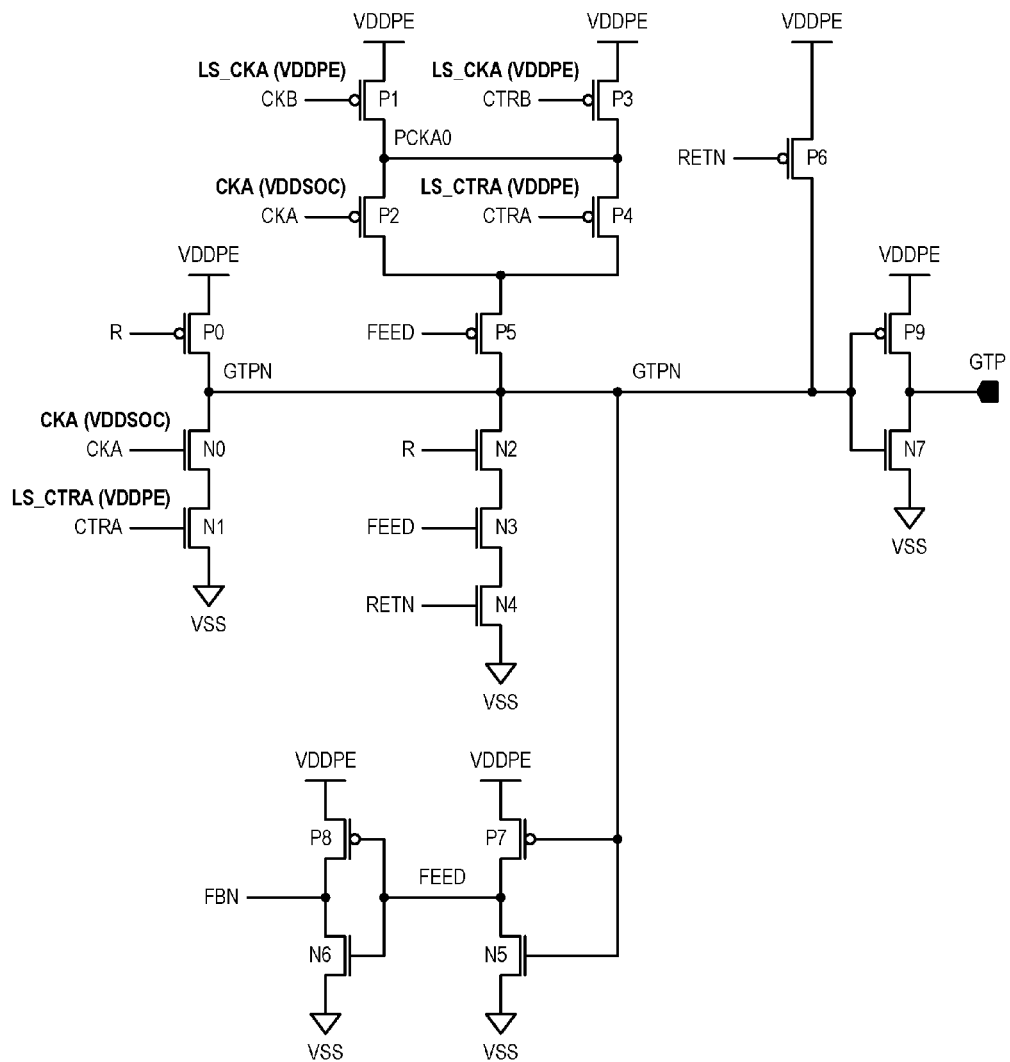
Figure 2D:
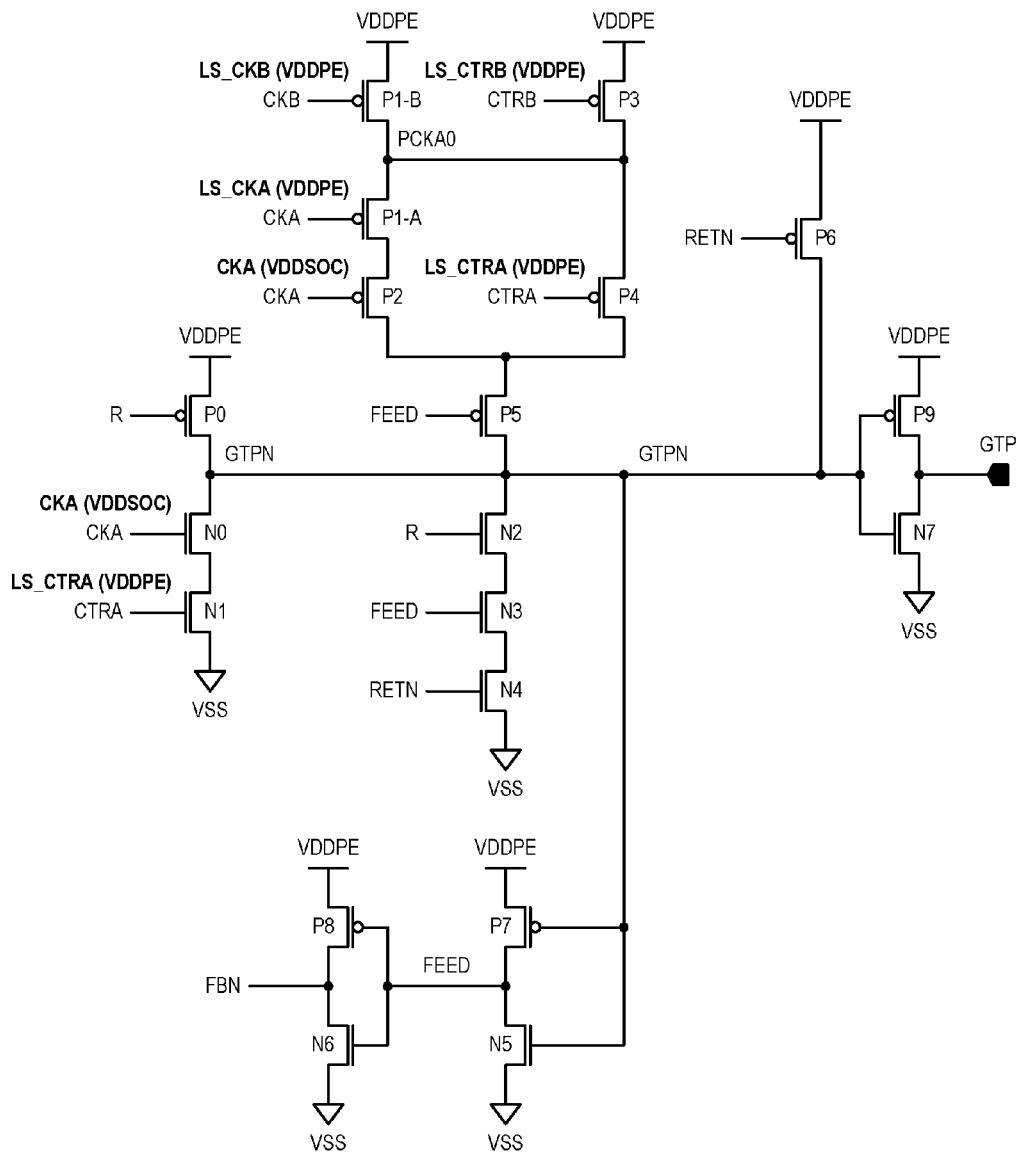

FIGS. 2A-2D illustrate various diagrams of the clock generation circuitry 120 in accordance with various implementations described herein. In reference to FIGS. 2A-2D, the clock generation circuitry 120 may be implemented as an integrated circuit that is configured for memory applications that supports large range level shifting to enable dynamic voltage frequency scaling in multiple voltage domains. For instance, FIG. 2A illustrates a first implementation 200A of the clock generation circuitry 120, FIG. 2B illustrates a second implementation 200B of the clock generation circuitry 120, FIG. 2C illustrates a third implementation 200C of the clock generation circuitry 120, and FIG. 2D illustrates a fourth implementation 200D of the clock generation circuitry 120.

As described herein above, the level shift circuitry 104 receives the clock signal CKA in the first voltage domain from the first voltage supply VDDSOC and provides a level shifted clock signal LS_CKA in the second voltage domain based on the second voltage supply VDDPE that is different than the first voltage supply VDDSOC. The second voltage domain is different than the first voltage domain. In some implementations, the level shift circuitry 104 may receive the clock signal CKA in the first voltage domain as a first direct input from the first voltage supply (VDDSOC).

As shown in FIG. 2A, the clock generator pulse circuitry 120 may receive the clock signal CKA (e.g., as CKA (VDDSOC)) in the first voltage domain from the first voltage supply and may further receive the level shifted chip enable signal LS_CTRA (e.g., as LS_CTRA (VDDPE)) in the second voltage domain from the level shift circuitry 104. Here, LS_CKA and LS_CTRA are level shifted signals from different inputs CKA and CENA, respectively. Generally, various different naming conventions may be used to refer to these signals CKA, LS_CKA as CLK, CTRA, respectfully.

In various implementations, the clock signal CKA refers to a first input signal CKA, and a second input signal CTRA refers to a first chip enable (CENA) signal, which may be implemented as the level shifted (LS) signal. Further, a third input signal CKB and fourth input signal CTRB refers to inputs used in special types of memories (e.g., dual pump, dual rail or dual port) to enable a second internal clock or Global Timing Pulse (GTP) in a same external clock cycle. For other single and dual port memories, the CKB and CTRB inputs may be coupled to ground (GND, VSS), such as, e.g., a logic zero signal (LOGO), as shown in FIGS. 2A-2D. A fifth input signal R refers to an internal reset input, and a sixth input signal RETN refers to a memory retention (sleep) input. A first timing signal GTP refers to the Global Timing Pulse, and a second timing pulse GTPN refers to a compliment of Global Timing Pulse.

The clock generator pulse circuitry 120 may include multiple circuit devices or components, such as, e.g., transistors, that may be arranged to implement and support large range level shifting to enable dynamic voltage frequency scaling in multiple voltage domains. As shown, the clock generator pulse circuitry 120 may be implemented with complementary metal-oxide-semiconductor (CMOS) devices, such as, e.g., P-type MOS (PMOS) transistors, and N-type MOS (NMOS) transistors.

As described herein above, the level shift circuitry 104 receives the clock signal CKA (i.e., clock input signal) in the first voltage domain as a first direct input from the first voltage supply (VDDSOC). Further, the clock generator pulse circuitry 120 is separate from the level shift circuitry 102, and as such, the clock generator pulse circuitry 120 may separately receive the clock signal CKA (i.e., clock input signal as CKA) in the first voltage domain as a second direct input from the first voltage supply (VDDSOC).

In some implementations, the clock generator pulse circuitry 120 includes a first clock driver transistor NO (NMOS) that is activated based on receiving the input clock signal CKA (i.e., CKA (VDDSOC)). The clock generator pulse circuitry 120 includes a first chip enable driver transistor N1 (NMOS) that is activated based on receiving the level shifted chip enable signal CTRA (i.e., LS_CTRA (VDDPE)). Further, the clock generator pulse circuitry 120 may provide an output clock signal GTP (i.e., Global Timing Pulse) based on a clocked activation cycle (or clocked activation frequency) of the first clock driver transistor NO and the first chip enable driver transistor N1. In some implementations, the first chip enable driver transistor N1 (NMOS) may be referred to as a clock driver transistor, such as, e.g., a second clock driver transistor.

As further shown in FIG. 2A, the clock generator pulse circuitry 120 may include a second feedback transistor P2 (PMOS) that is activated based on receiving the input clock signal CKA (i.e., CKA(VDDSOC)). The clock generator pulse circuitry 120 may further include a fourth feedback transistor P4 (PMOS) that is activated based on receiving the level shifted chip enable signal CTRA (i.e., LS_CTRA (VDDPE)). In this implementation, the clock generator pulse circuitry 120 provides the output clock signal GTP based on the clocked activation cycle (or clocked activation frequency) of the transistors NO (NMOS), P2 (PMOS) and the transistors N1 (NMOS), P4 (PMOS).

The clock generator pulse circuitry 120 may include another input transistor P0 (PMOS) that receives the internal reset input signal R. The input transistor P0 (PMOS) may be coupled to the first clock driver transistor NO (NMOS) at node GTPN.

The clock generator pulse circuitry 120 may include a first feedback transistor P1 (PMOS) having a gate that may be coupled to ground (GND, VSS), such as, e.g., logic zero signal (LOGO). As shown, the first feedback transistor P1 (PMOS) may be coupled to the second feedback transistor P2 (PMOS) at node PCKA0. Further, the first feedback transistor P1 (PMOS) may be coupled between the periphery voltage supply VDDPE and the second feedback transistor P2 (PMOS).

Further, the clock generator pulse circuitry 120 may include a third feedback transistor P3 (PMOS) having a gate that may be coupled to ground (GND, VSS), such as, e.g., logic zero signal (LOGO). As shown, the third feedback transistor P3 (PMOS) may be coupled to the fourth feedback transistor P4 (PMOS) at node PCKA0. The third feedback transistor P3 (PMOS) may be coupled between the periphery voltage supply VDDPE and the fourth feedback transistor P4 (PMOS).

The clock generator pulse circuitry 120 may include another input transistor P5 (PMOS). As shown, the second feedback transistor P2 (PMOS) and the fourth feedback transistor P4 (PMOS) may be coupled to the input transistor P5 (PMOS), and the input transistor P5 (PMOS) may be coupled to the node GTPN. The input transistor P5 (PMOS) may receive the feed signal FEED.

The clock generator pulse circuitry 120 may include a stack of transistors including input transistors N2 (NMOS), N3 (NMOS), and N4 (NMOS). As shown, the input transistor N2 (NMOS) may receive the internal reset input signal R, the input transistor N3 (NMOS) may receive the feed signal FEED, and the input transistor N4 (NMOS) may receive the memory retention (sleep) input signal RETN.

The clock generator pulse circuitry 120 may include another input transistor P6 (PMOS) that may be coupled between the periphery voltage supply VDDPE and the GTPN node. Further, as shown, the input transistor P6 (PMOS) receives the memory retention (sleep) input signal RETN.

The clock generator pulse circuitry 120 may include a transistor group including input transistors P7 (PMOS), N5 (NMOS), P8 (PMOS), and N6 (NMOS). As shown, the input transistor P7 (PMOS) may be stacked with the input transistor N5 (NMOS), which may be arranged between the periphery voltage supply VDDPE and ground voltage supply VSS. The input transistors P7 (PMOS) and N5 (NMOS) may also be arranged to receive the node signal GTPN and provide the feed signal FEED. Further, the input transistor P8 (PMOS) may be stacked with the input transistor N6 (NMOS), which may be arranged between the periphery voltage supply VDDPE and the ground voltage supply (VSS). The input transistors P8 (PMOS) and N6 (NMOS) may be arranged to receive the feed signal FEED and provide another output signal FBN. In some instances, the output signal FBN may be used as a reset signal for CTRA after GTP is generated.

The clock generator pulse circuitry 120 may include another transistor group including output transistors P9 (PMOS) and N7 (NMOS). As shown, the output transistor P7 (PMOS) may be stacked with the output transistor N7 (NMOS), which may be arranged between the periphery voltage supply VDDPE and the ground voltage supply VSS. The input transistors P9 (PMOS) and N7 (NMOS) may also be arranged to receive the node signal GTPN and provide the output signal GTP. In some scenarios, the output transistors P9 (PMOS) and N7 (NMOS) may be implemented as an inverter that receives the node signal GTPN and provides the output signal GTP, as a complement signal.

In other cases, some input signals may be modified. For instance, as shown in FIG. 2B, the clock generator pulse circuitry 120 may include the second feedback transistor P2 (PMOS) that is activated based on receiving the level shifted clock signal CKA (i.e., LS_CKA (VDDPE)). The clock generator pulse circuitry 120 may include the fourth feedback transistor P4 (PMOS) that is activated based on receiving the level shifted clock signal CTRA (i.e., LS_CTRA (VDDPE)). In this implementation, the clock generator pulse circuitry 120 may provide the output clock signal GTP based on the clocked activation cycle (or clocked activation frequency) of the transistors NO (NMOS), P2 (PMOS) and the transistors N1 (NMOS), P4 (PMOS) with modified input signals.

In another implementation, as shown in FIG. 2C, the clock generator pulse circuitry 120 may include the first feedback transistor P1 (PMOS) that may be activated based on receiving the level shifted clock signal CKA (i.e., LS_CKA (VDDPE)). Further, the clock generator pulse circuitry 120 may include the third feedback transistor P3

(PMOS) that may be activated based on receiving the level shifted clock signal CKA (i.e., LS_CKA (VDDPE)). In this implementation, the clock generator pulse circuitry 120 may provide the output clock signal GTP based on the clocked activation cycle (or clocked activation frequency) of the transistors N0 (NMOS), P2 (PMOS) and the transistors N1 (NMOS), P4 (PMOS) with one or more modified input signals.

The clock generator pulse circuit 120 may be modified for pseudo 2-port/dual port memory application. For instance, as shown in FIG. 2D, the clock generator pulse circuitry 120 may include a clock driver transistor P1-A (PMOS) for a first port A (CKA) that may be activated based on receiving the level shifted clock signal CKA (i.e., LS_CKA (VDDPE)). The clock generator pulse circuitry 120 may include a clock driver transistor P1-B (PMOS) for a second port B (CKB) that may be activated based on receiving another level shifted clock signal CKB (i.e., LS_CKB (VDDPE)). Further, the clock generator pulse circuitry 120 may include the third feedback transistor P3 (PMOS) that may be activated based on receiving another level shifted chip enable signal CTRB (i.e., LS_CTRB (VDDPE)). In this implementation, the clock generator pulse circuitry 120 may provide the output clock signal GTP based on the clocked activation cycle (or clocked activation frequency) of the transistors N0 (NMOS), P1-A (PMOS), P1-B (PMOS), and/or P2 (PMOS), and the transistors N1 (NMOS), P3 (PMOS), and/or P4 (PMOS) with one or more modified input signals.

In reference to FIGS. 2A-2D, the clock generation circuitry 120 may operate in various different mode of operation. For instance, in some scenarios, during a chip enable mode of operation, the CTRA input may be setup HIGH in reference to CKA, and when the CKA (CKA) signal goes HIGH, it pulls the GTPN node LOW. The GTPN node may be followed by an inverter stage (P9, N7) that provides the memory internal clock (GTP). The GTP signal may be self-timed in some memory applications; i.e., when the memory operation completes, the reset signal (R) goes LOW, which pulls the GTPN back HIGH. During a memory retention mode of operation, the RETN signal may be low, which clamps the GTPN signal high.

One approach to the issue of large range level shifting is to level shift all inputs inside the memories from a low VDDSOC to a higher VDDPE domain. That may enable VDDSOC to be lower than VDDPE by ~600-700 mV. In some cases, this may allow memory periphery voltage (VDDPE) to be similar to a higher bitcell array voltage and an internal circuit limitation may be avoided. However, this may cause delay in an internal clock generation circuit that is inside the memory which may lead to increase in memory access (CKA-to-Q) timing (>10 ps) in a related PPA corner.

So as to avoid delay to the CKA-to-Q timing when all memory inputs including the clock are level shifted; another approach may be to directly send an external clock from the VDDSOC voltage domain to the CKA input without going through a level shifter. Some improvement may occur in the delay of the circuit. If the VDDSOC domain lowers beyond a point, some failures may happen because, at low VDDSOC voltage on the clock, the PMOS stack may only be partially cut-off.

In reference to FIG. 2A, the clock generator pulse circuitry 120 is shown with input signals level shifted to the VDDPE domain except for the external clock CKA, which is coupled directly to the CKA input at the transistors N0 (NMOS) and P2 (PMOS).

In another approach, as shown in FIG. 2B, the VDDPE level shifted LS_CKA may be coupled to the gate of P2 node input while keeping the VDDSOC domain CKA going into gate of N0. The idea behind this is that coupling the clock signal CKA directly sent to N0 input without level shifter may ensure that there is no speed degradation to the CKA-to-Q timing, and coupling the VDDPE level shifted clock LS_CKA to P2 input may close the PMOS stack completely. However, the level shifted clock LS_CKA may arrive with some delay to the P2 node, and until that time, the PMOS stack may be completely ON and thus may fight to keep the GTPN node HIGH.

In reference to FIG. 2B, the clock generator pulse circuitry 120 is shown with input signals level shifted to the VDDPE domain except for the external clock CKA, which is coupled directly to the CKA input at the transistor N0. Also, the level shifted clock signal LS_CKA in the VDDPE domain may be sent to the CKA input at the transistor P2.

FIG. 2C provides another approach for improving reliability of internal clock generation and enable it to support lower VDDSOC with less negative impact on the CKA-to-Q timing. As shown, the circuit sends the external clock CKA in the VDDSOC domain, and the level shifted external clock LS CKA in the VDDPE domain coupled to the CKB input and the CTRB input instead of logic zero (LOGO). By having the clock signal CKA sent directly to the CKA input without level shifter may ensure that there is no speed degradation to the CKA-to-Q timing. However, by having the level shifted clock LS_CKA sent to the CKB input may also assist with cutting-off the PMOS stack completely thus leading to a tighter spread of NGTP. It should be noted that, in some implementations, improvement may be achieved with little or no speed degradation at a VDDSOC=VDDPE corner, and improvement in delay may also be achieved, along with a significantly tighter spread at a VDDPE>>VDDSOC corner.

In reference to FIG. 2C, the clock generator pulse circuitry 120 may operate with input signals level shifted to the VDDPE domain except the clock signal CKA. Also, the level shifted clock signal LS_CKA may be sent to the CKB and CTRB inputs at the transistors P1, P3, respectively, instead of logic zero (LOGO). In some instances, the clock signal CKA may be referred to as a first clock signal CLK_A, and the clock signal CKB may be referred to as a second clock signal CLK_B that may be different than the first clock signal CLK_A.

Figure 3:
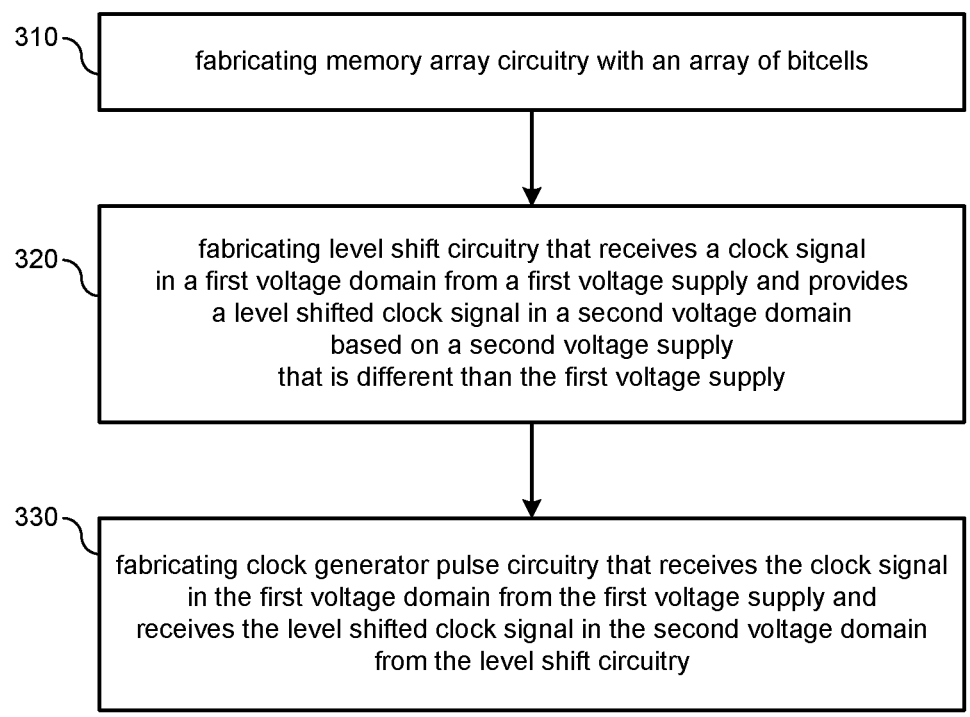
FIG. 3 illustrates a process flow of a method of fabricating clock generation circuitry in accordance with various implementations described herein.

FIG. 3 illustrates a process flow diagram of a method for 300 fabricating clock generation circuitry in accordance with various implementations described herein.

It should be understood that even though method 300 may indicate a particular order of operation execution, in some cases, various certain portions of the operations may be executed in a different order, and on different systems. In some other cases, additional operations and/or steps may be added to and/or omitted from method 300. Further, method 300 may be implemented in hardware and/or software. If implemented in hardware, the method 300 may be implemented with various circuit components, such as described herein above in reference to FIGS. 1A-2D. If implemented in software, the method 300 may be implemented as a program or software instruction process that may be configured for clock pulse generation as described herein. Further, if implemented in software, instructions related to implementing the method 300 may be stored in memory and/or a database. For instance, a computer or various other types of computing devices having a processor and memory may be configured to perform method 300.

In reference to FIG. 3, method 300 may be utilized for manufacturing an integrated circuit that implements clock generation circuitry, e.g., in memory applications, including single port memory applications and dual port memory applications. Further, the integrated circuit may be configured for memory applications that supports large range level shifting to enable dynamic voltage frequency scaling in multiple voltage domains, including multiple different voltage domains.

At block 310, method 300 may fabricate memory array circuitry with an array of bitcells. The array of bitcells may be arranged in columns and rows. The memory array circuitry may further include input/output (I/O) circuitry for accessing each bitcell in the array of bitcells via a selected wordline and a selected bitline. The memory array circuitry may further include control circuitry having a row decoder and a column decoder for selecting each bitcell in the array of bitcells with a wordline signal and a bitline signal.

At block 320, method 300 may fabricate level shift circuitry that receives a clock signal in a first voltage domain from a first voltage supply (e.g., system-on-a-chip (SOC) logic voltage supply (VDDSOC)) and provides a level shifted clock signal in a second voltage domain based on a second voltage supply (e.g., periphery voltage supply (VDDPE)) that is different than the first voltage supply (e.g., SOC voltage supply (VDDSOC)). The second voltage domain may be different than the first voltage domain. The level shift circuitry may receive the clock signal in the first voltage domain as a first direct input from the second voltage supply (e.g., SOC logic voltage supply (VDDSOC)).

At block 330, method 300 may fabricate clock generator pulse circuitry that receives the clock signal in the first voltage domain from the first voltage supply (e.g., SOC voltage supply (VDDSOC)) and receives the level shifted clock signal in the second voltage domain from the level shift circuitry. In some implementations, the clock generator pulse circuitry may include a clock driver transistor that is activated based on receiving the clock signal. The clock generator pulse circuitry may include a feedback transistor that is activated based on receiving the level shifted clock signal. The clock generator pulse circuitry may provide an output clock signal to the memory array circuitry based on clocked activation cycle of the clock driver transistor and the feedback transistor. The clock generator pulse circuitry may be separate from the level shift circuitry, and the clock generator pulse circuitry may separately receive the clock signal in the first voltage domain as a second direct input from the SOC logic voltage supply (VDDSOC).

Described herein are implementations of an integrated circuit. The integrated circuit may include level shift circuitry that receives a clock signal based on a first voltage supply and provides a level shifted clock signal based on a second voltage supply that is different than the first voltage supply. The integrated circuit may include clock generator pulse circuitry that receives the clock signal based on the first voltage supply and receives the level shifted clock signal based on the second voltage supply from the level shift circuitry. The clock generator pulse circuitry may include a clock driver transistor that is activated based on receiving the clock signal. The clock generator pulse circuitry may include a feedback transistor that is activated based on receiving the level shifted clock signal. The clock generator pulse circuitry may provide an output clock signal based on a clocked activation cycle of the clock driver transistor and the feedback transistor.

Described herein are implementations of an integrated circuit having memory array circuitry with an array of bitcells. The integrated circuit may include level shift circuitry that receives a clock signal based on a first voltage supply and provides a level shifted clock signal based on a second voltage supply that is different than the first voltage supply. The integrated circuit may include clock generator pulse circuitry that receives the clock signal based on the first voltage supply and receives the level shifted clock signal based on the second voltage supply from the level shift circuitry. The clock generator pulse circuitry may include a clock driver transistor that is activated based on receiving the clock signal. The clock generator pulse circuitry may include a feedback transistor that is activated based on receiving the level shifted clock signal. The clock generator pulse circuitry may provide an output clock signal to the memory array circuitry based on a clocked activation cycle of the clock driver transistor and the feedback transistor.

Described herein are various implementations of a method for manufacturing an integrated circuit. The method may include fabricating level shift circuitry that receives a clock signal based on a first voltage supply and provides a level shifted clock signal based on a second voltage supply that is different than the first voltage supply. The method may include fabricating clock generator pulse circuitry that receives the clock signal based on the first voltage supply and receives the level shifted clock signal based on the second voltage supply from the level shift circuitry. The clock generator pulse circuitry may include a clock driver transistor that is activated based on receiving the clock signal. The clock generator pulse circuitry may include a feedback transistor that is activated based on receiving the level shifted clock signal. The clock generator pulse circuitry may provide an output clock signal based on a clocked activation cycle of the clock driver transistor and the feedback transistor.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   level shift circuitry that receives a clock signal based on a first voltage supply and provides a level shifted clock signal based on a second voltage supply that is different than the first voltage supply; and
   clock generator pulse circuitry that receives the clock signal based on the first voltage supply and receives the level shifted clock signal based on the second voltage supply from the level shift circuitry,
   wherein the clock generator pulse circuitry includes a clock driver transistor that is activated based on receiving the clock signal, wherein the clock driver transistor is coupled to a node,
   wherein the clock generator pulse circuitry includes a feedback transistor that is activated based on receiving the level shifted clock signal, wherein the feedback transistor is coupled to the node, and
   wherein the clock generator pulse circuitry provides an output clock signal based on a clocked activation cycle of the clock driver transistor and the feedback transistor.

2. The integrated circuit of claim 1, wherein the integrated circuit is configured for memory applications that supports large range level shifting to enable dynamic voltage frequency scaling in multiple voltage domains.

3. The integrated circuit of claim 1, wherein the first voltage supply comprises a system-on-a-chip (SOC) logic voltage supply (VDDSOC), and wherein the second voltage supply comprises a periphery voltage supply (VDDPE).

4. The integrated circuit of claim 1, wherein the first voltage supply is in a first voltage domain, wherein the second voltage supply is in a second voltage domain, and wherein the second voltage domain is different than the first voltage domain.

5. The integrated circuit of claim 1, further comprising:
   memory array circuitry having an array of bitcells arranged in columns and rows;
   input/output circuitry for accessing each bitcell in the array of bitcells via a selected wordline and a selected bitline; and
   control circuitry having a row decoder and a column decoder for selecting each bitcell in the array of bitcells with a wordline signal and a bitline signal.

6. The integrated circuit of claim 1, wherein the level shift circuitry receives the clock signal based on the first voltage supply as a first direct input from the first voltage supply.

7. The integrated circuit of claim 6, wherein the clock generator pulse circuitry is separate from the level shift circuitry, and wherein the clock generator pulse circuitry separately receives the clock signal based on the first voltage supply as a second direct input from the first voltage supply.

8. The integrated circuit of claim 1, wherein the clock driver transistor of the clock generator pulse circuitry is a first clock driver transistor, and wherein the clock generator pulse circuitry includes a second clock driver transistor that is activated based on receiving a level shifted chip enable signal.

9. The integrated circuit of claim 8, wherein the feedback transistor of the clock generator pulse circuitry is a first feedback transistor, and wherein the clock generator pulse circuitry includes a second feedback transistor that is activated based on receiving the clock signal.

10. The integrated circuit of claim 9, wherein the clock generator pulse circuitry provides the output clock signal based on the clocked activation cycle of the first and second clock driver transistors and the first and second feedback transistors.

11. The integrated circuit of claim 1, wherein the clock driver transistor of the clock generator pulse circuitry is a first clock driver transistor, and wherein the clock generator pulse circuitry includes a second clock driver transistor that is activated based on receiving the level shifted clock signal.

12. The integrated circuit of claim 11, wherein the feedback transistor of the clock generator pulse circuitry is a first feedback transistor, and wherein the clock generator pulse circuitry includes a second feedback transistor that is activated based on receiving the clock signal.

13. The integrated circuit of claim 12, wherein the clock generator pulse circuitry provides the output clock signal based on the clocked activation cycle of the first and second clock driver transistors and the first and second feedback transistors.

14. An integrated circuit, comprising:
   memory array circuitry having an array of bitcells;
   level shift circuitry that receives a clock signal based on a first voltage supply and provides a level shifted clock signal based on a second voltage supply that is different than the first voltage supply; and clock generator pulse circuitry that receives the clock signal based on the first voltage supply and receives the level shifted clock signal based on the second voltage supply from the level shift circuitry, wherein the clock generator pulse circuitry includes a clock driver transistor that is activated based on receiving the clock signal, wherein the clock driver transistor is coupled to a node, wherein the clock generator pulse circuitry includes a feedback transistor that is activated based on receiving the level shifted clock signal, wherein the feedback transistor is coupled to the node, and wherein the clock generator pulse circuitry provides an output clock signal to the memory array circuitry based on a clocked activation cycle of the clock driver transistor and the feedback transistor.

15. The integrated circuit of claim 14, wherein the first voltage supply comprises a system-on-a-chip (SOC) logic voltage supply (VDDSOC), and wherein the second voltage supply comprises a periphery voltage supply (VDDPE).

16. The integrated circuit of claim 14,
wherein the clock driver transistor of the clock generator pulse circuitry is a first clock driver transistor,
wherein the clock generator pulse circuitry includes a second clock driver transistor that is activated based on receiving the clock signal,
wherein the feedback transistor of the clock generator pulse circuitry is a first feedback transistor,
wherein the clock generator pulse circuitry includes a second feedback transistor that is activated based on receiving the clock signal, and
wherein the clock generator pulse circuitry provides the output clock signal based on the clocked activation cycle of the first and second clock driver transistors and the first and second feedback transistors.

17. The integrated circuit of claim 14,
wherein the clock driver transistor of the clock generator pulse circuitry is a first clock driver transistor,
wherein the clock generator pulse circuitry includes a second clock driver transistor that is activated based on receiving the level shifted clock signal,
wherein the feedback transistor of the clock generator pulse circuitry is a first feedback transistor,
wherein the clock generator pulse circuitry includes a second feedback transistor that is activated based on receiving the clock signal, and
wherein the clock generator pulse circuitry provides the output clock signal based on the clocked activation cycle of the first and second clock driver transistors and the first and second feedback transistors.

18. A method for manufacturing an integrated circuit, the method comprising:

fabricating level shift circuitry that receives a clock signal based on a first voltage supply and provides a level shifted clock signal based on a second voltage supply that is different than the first voltage supply; and fabricating clock generator pulse circuitry that receives the clock signal based on the first voltage supply and receives the level shifted clock signal based on the second voltage supply from the level shift circuitry, wherein the clock generator pulse circuitry includes a clock driver transistor that is activated based on receiving the clock signal, wherein the clock driver transistor is coupled to a node, wherein the clock generator pulse circuitry includes a feedback transistor that is activated based on receiving the level shifted clock signal, wherein the feedback transistor is coupled to the node, and wherein the clock generator pulse circuitry provides an output clock signal based on a clocked activation cycle of the clock driver transistor and the feedback transistor.

19. The method of claim 18,
wherein the clock driver transistor of the clock generator pulse circuitry is a first clock driver transistor,
wherein the clock generator pulse circuitry includes a second clock driver transistor that is activated based on receiving the clock signal,
wherein the feedback transistor of the clock generator pulse circuitry is a first feedback transistor,
wherein the clock generator pulse circuitry includes a second feedback transistor that is activated based on receiving the clock signal, and
wherein the clock generator pulse circuitry provides the output clock signal based on the clocked activation cycle of the first and second clock driver transistors and the first and second feedback transistors.

20. The method of claim 18,
wherein the clock driver transistor of the clock generator pulse circuitry is a first clock driver transistor,
wherein the clock generator pulse circuitry includes a second clock driver transistor that is activated based on receiving the level shifted clock signal,
wherein the feedback transistor of the clock generator pulse circuitry is a first feedback transistor,
wherein the clock generator pulse circuitry includes a second feedback transistor that is activated based on receiving the clock signal, and
wherein the clock generator pulse circuitry provides the output clock signal based on the clocked activation cycle of the first and second clock driver transistors and the first and second feedback transistors.

* * * * *